US009118459B2

United States Patent
Miyanaga et al.

(10) Patent No.: US 9,118,459 B2
(45) Date of Patent: Aug. 25, 2015

(54) WIRELESS COMMUNICATION DEVICE AND ACTIVATION METHOD OF THE WIRELESS COMMUNICATION DEVICE

(71) Applicant: PANASONIC CORPORATION, Osaka (JP)

(72) Inventors: Kenji Miyanaga, Kanagawa (JP); Noriaki Saito, Tokyo (JP); Takayuki Tsukizawa, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/395,266

(22) PCT Filed: Dec. 25, 2013

(86) PCT No.: PCT/JP2013/007601
§ 371 (c)(1),
(2) Date: Oct. 17, 2014

(87) PCT Pub. No.: WO2014/128815
PCT Pub. Date: Aug. 28, 2014

(65) Prior Publication Data
US 2015/0071394 A1 Mar. 12, 2015

(30) Foreign Application Priority Data

Feb. 21, 2013 (JP) .................. 2013-032001

(51) Int. Cl.
*H04L 7/04* (2006.01)
*H04B 1/40* (2015.01)

(52) U.S. Cl.
CPC ... *H04L 7/04* (2013.01); *H04B 1/40* (2013.01)

(58) Field of Classification Search
CPC ........................................................ H04L 7/04
See application file for complete search history.

(56) References Cited

U.S. PATENT DOCUMENTS

| 7,197,283 | B1 * | 3/2007 | Baringer et al. ................ 455/76 |
| 7,203,457 | B1 * | 4/2007 | Wetzel ......................... 455/3.02 |
| 2004/0264227 | A1 * | 12/2004 | Kojima et al. .................. 365/45 |
| 2005/0227648 | A1 * | 10/2005 | Tan ........................... 455/154.1 |
| 2006/0280483 | A1 | 12/2006 | Tsuruga |
| 2007/0240184 | A1 | 10/2007 | Terada et al. |

(Continued)

FOREIGN PATENT DOCUMENTS

| JP | 2006-115130 A | 4/2006 |
| JP | 2006-345223 A | 12/2006 |

(Continued)

OTHER PUBLICATIONS

International Search Report for Application No. PCT/JP2013/007601 dated Aug. 1, 2014.

*Primary Examiner* — Erin File
(74) *Attorney, Agent, or Firm* — Pearne & Gordon LLP

(57) ABSTRACT

A wireless communication device includes a BBIC for performing baseband signal processing, an RFIC for performing radio-frequency signal processing, and a quartz resonator. The RFIC has a storage unit which stores an adjustment value for adjustment of a clock frequency that is based on an oscillation frequency of the quartz resonator, and outputs the adjustment value when its resetting active state is canceled; a frequency adjusting unit for adjusting the clock frequency according to the adjustment value; and an RF signal processing unit which operates based on the clock signal and performs the radio-frequency signal processing.

10 Claims, 6 Drawing Sheets

(56) References Cited

U.S. PATENT DOCUMENTS

| | | |
|---|---|---|
| 2008/0192877 A1* | 8/2008 | Eliezer et al. .................. 375/376 |
| 2008/0285684 A1* | 11/2008 | Shen et al. .................... 375/324 |
| 2008/0287076 A1* | 11/2008 | Shen et al. ................. 455/114.3 |
| 2010/0208528 A1 | 8/2010 | Mizukane et al. |
| 2010/0302875 A1 | 12/2010 | Mizukane et al. |
| 2011/0193640 A1 | 8/2011 | Oishi et al. |
| 2012/0026039 A1* | 2/2012 | Ganeshan et al. ....... 342/357.73 |
| 2012/0299663 A1 | 11/2012 | Oishi et al. |
| 2014/0036904 A1 | 2/2014 | Mutou |

FOREIGN PATENT DOCUMENTS

| | | |
|---|---|---|
| JP | 2007-282067 A | 10/2007 |
| JP | 2007-334514 A | 12/2007 |
| JP | 4413753 B2 | 11/2009 |
| JP | 2010-192042 A | 9/2010 |
| JP | 2011-024232 A | 2/2011 |
| JP | 4728655 B2 | 4/2011 |
| JP | 2011-166368 A | 8/2011 |
| WO | 2012/144558 A1 | 10/2012 |

* cited by examiner

WIRELESS COMMUNICATION DEVICE AND ACTIVATION METHOD OF THE WIRELESS COMMUNICATION DEVICE

TECHNICAL FIELD

The present invention relates to a wireless communication device in which the frequency of a reference clock that is supplied to ICs is adjusted, as well as an activation method of this wireless communication device.

BACKGROUND ART

Mobile apparatus such as cellphones and notebook personal computers have a wireless communication function for performing a data communication with an external apparatus.

FIG. 6 shows the configuration of a wireless LAN device disclosed in Patent document 1. The wireless LAN device shown in FIG. 6 is composed of an IC chip 4 which performs radio-frequency signal processing, an IC chip 2 which performs baseband signal processing, an oscillator 3 which supplies a clock signal to the IC chip 2, an oscillator 5 which supplies a clock signal to the IC chip 4, and an antenna 6. The wireless LAN device receives, from a host CPU 1, information to be sent to another terminal, modulates it, and sends out a resulting signal from the antenna 6. Furthermore, the wireless LAN device receives a signal transmitted from another terminal by the antenna 6, demodulates it, and transfers a resulting signal to the host CPU 1.

The IC chip 2 is supplied with a clock signal from the oscillator 3. This clock signal is used for allowing an intra-chip CPU 22 to operate. The IC chip 4 is supplied with a clock signal from the oscillator 5. This clock signal is also supplied to the IC chip 2 via the IC chip 4. A BB processing unit 24 and a MAC processing unit 23 which are provided in the IC chip 2 operate on the clock signal that is supplied via the IC chip 4.

PRIOR ART DOCUMENTS

Patent Documents

Patent document 1: JP-B-4413753
Patent document 2: JP-A-2010-192042
Patent document 3: JP-A-2007-334514
Patent document 4: JP-A-2006-115130
Patent document 5: JP-B-4728655
Patent document 6: JP-A-2011-166368

SUMMARY OF THE INVENTION

Problems to Be Solved by the Invention

Clock signals that are used in IC chips are required to be highly accurate in frequency. Oscillation circuits as clock signal sources are composed of a quartz resonator which oscillates at a natural frequency and a frequency adjusting unit for driving the quartz resonator. It is desirable that the frequency adjusting unit be incorporated in the IC chip and the quartz resonator be provided outside the IC chip. The frequency adjusting unit adjusts the oscillation frequency etc. of a clock signal by adjusting a constant(s) such as a load capacitance of the oscillation circuit.

Usually, an adjustment value(s) for adjustment of a constant of an oscillation circuit is stored in a nonvolatile memory such as a fuse memory or a flash memory provided in an IC chip (refer to, for example, the disclosure of paragraph [0025] of Patent document 6). An oscillation frequency deviation due to a variation of an individual oscillation circuit including a quartz resonator can be corrected for by, for example, pre-adjusting a value stored in a fuse memory.

Among fuse memories, which are write-once (writing can be done only once) memories, are ones in which a value(s) is written with electrical programming and ones in which a value(s) is written by laser cutting. Once written, a value is stored even after a stop of power supply. And the same value is obtained when power is supplied again.

There are fuse memories which are provided with a reset terminal. To read a correct value(s) from such fuse memories, it is necessary to make activation of resetting after power-on (refer to, for example, the disclosure of paragraph [0003] of Patent document 2). Usually, a value indicated by all—"1" (or all—"0") data is output from a fuse memory whose resetting is in an active state. And the value written in the fuse memory is output when the resetting is cancelled.

However, the following problem would arise if the function of adjusting the oscillation frequency of a clock signal using a fuse memory as described above is applied to the wireless LAN device disclosed in Patent document 1. As mentioned above, to read a correct adjustment value from a fuse memory having a reset terminal, it is necessary to cancel an active state of resetting of the fuse memory. While resetting of the fuse memory in the active state, since no adjustment value for adjustment of the oscillation frequency of a clock signal to a desired value is output from the fuse memory, the oscillation circuit may not oscillate and hence output no clock signal. On the other hand, an IC chip which performs radio-frequency signal processing or baseband signal processing also has a reset terminal; when it is powered on, it is necessary to make resetting of the IC chip active temporarily and then cancel that state. That is, at the time of power-on, a clock signal is not supplied and a wireless LAM device cannot be activated correctly unless reset signals for the fuse memory and the IC chip are controlled properly. Incidentally, whereas Patent document 1 discloses the order of activation of clock signals and the signal processing circuits of the IC chips, it has no disclosure relating to reset signals.

Patent document 3 intends to activate a device quickly at the time of power-on without the need for using a timing adjusting means for waiting for a start of operation of a CPU. Patent document 3 discloses a configuration for supplying a common reset signal to plural ICs externally.

Patent document 4 intends to realize an inexpensive configuration for power-on resetting while increasing the degree of freedom of art work for a mounting board in an information processing apparatus in which the same clock signal is output to plural semiconductor integrated circuits. Patent document 4 discloses a configuration in which clock signals are supplied to other ICs from a certain, single IC as an origin and reset signals are supplied to the other ICs after a lapse of a prescribed time.

Patent document 5 intends to enable automatic recovery of, for example, a sub-CPU from an abnormal state in an apparatus which is composed of a main CPU, the sub-CPU, and a peripheral 10. Patent document 5 discloses a configuration in which the main CPU sends a reset signal to the sub-CPU and the sub-CPU sends a reset signal to the peripheral 10.

Each of Patent documents 3-5 assumes that each IC has only one reset terminal. Where this configuration is employed, resetting of a fuse memory an IC chip which performs radio-frequency signal processing and resetting of a signal processing circuit in the IC chip are canceled simultaneously. And an oscillation circuit starts oscillating as a result of the cancellation of the resetting of the fuse memory. However, an unstable clock signal is supplied to the IC chip from the start of oscillation of the oscillation circuit to stabilization of the oscillation. Such an unstable clock signal may cause an erroneous operation.

One measure against the above situation is to employ terminals to which respective reset signals for a fuse memory and an IC chip are supplied externally. However, in this case, a user needs to properly control the supply of plural reset signals, which means increase in user load. Furthermore, the increase in the number of terminals is an obstacle to miniaturization of a device.

An object of the present invention is to provide a wireless communication device which can be activated correctly at the time of power-on and can be miniaturized, as well as an activation method of this wireless communication device.

Means for Solving the Problems

The invention provides a wireless communication device having a BBIC that performs baseband signal processing, an RFIC that performs radio-frequency signal processing, and a quartz resonator, wherein the RFIC including: a storage unit that stores an adjustment value for adjusting a frequency of a clock signal that is based on an oscillation frequency of the quartz resonator, and outputs the adjustment value when a resetting of the storage unit is canceled from an active state; a frequency adjusting unit that adjusts the frequency of the clock signal according to the adjustment value stored in the storage unit; and an RF signal processing unit that operates based on the clock signal and performs the radio-frequency signal processing; wherein the clock signal output from an oscillation circuit having the quartz oscillator and the frequency adjusting unit is supplied to an RF signal processing unit and the BBIC; and wherein the BBIC controls the resetting of the storage unit and a resetting of the baseband signal processing to be performed by the BBIC.

An activation method of a wireless communication device having a BBIC that performs a baseband signal processing, an RFIC that performs a radio-frequency signal processing, and a quartz resonator, wherein the RFIC includes a storage unit that stores an adjustment value for adjusting a frequency of a clock signal that is based on an oscillation frequency of the quartz resonator, the activation method comprising: outputting the adjustment value by the storage unit when a resetting of the storage unit is canceled from an active state; adjusting the frequency of the clock signal according to the adjustment value stored in the storage unit; supplying the clock signal output from an oscillation circuit having the quartz oscillator to an RF signal processing unit and the BBIC; and controlling by the BBIC the resetting of the storage unit and a resetting of the baseband signal processing to be performed by the BBIC.

Advantageous Effects of the Invention

The invention can realize a wireless communication device which can be activated correctly at the time of power-on and can be miniaturized, as well as an activation method of this wireless communication device.

BRIEF DESCRIPTION OF THE DRAWINGS

FIG. 3 is a flowchart of an activation procedure which is followed when the wireless communication device 100 according to the first embodiment is powered on.

FIG. 5 is a flowchart of an activation procedure which is followed when the wireless communication device 200 according to the second embodiment is powered on.

MODES FOR CARRYING OUT THE INVENTION

Embodiments of the present invention will be hereinafter described with reference to the drawings.
(Embodiment 1)

Figure 1:
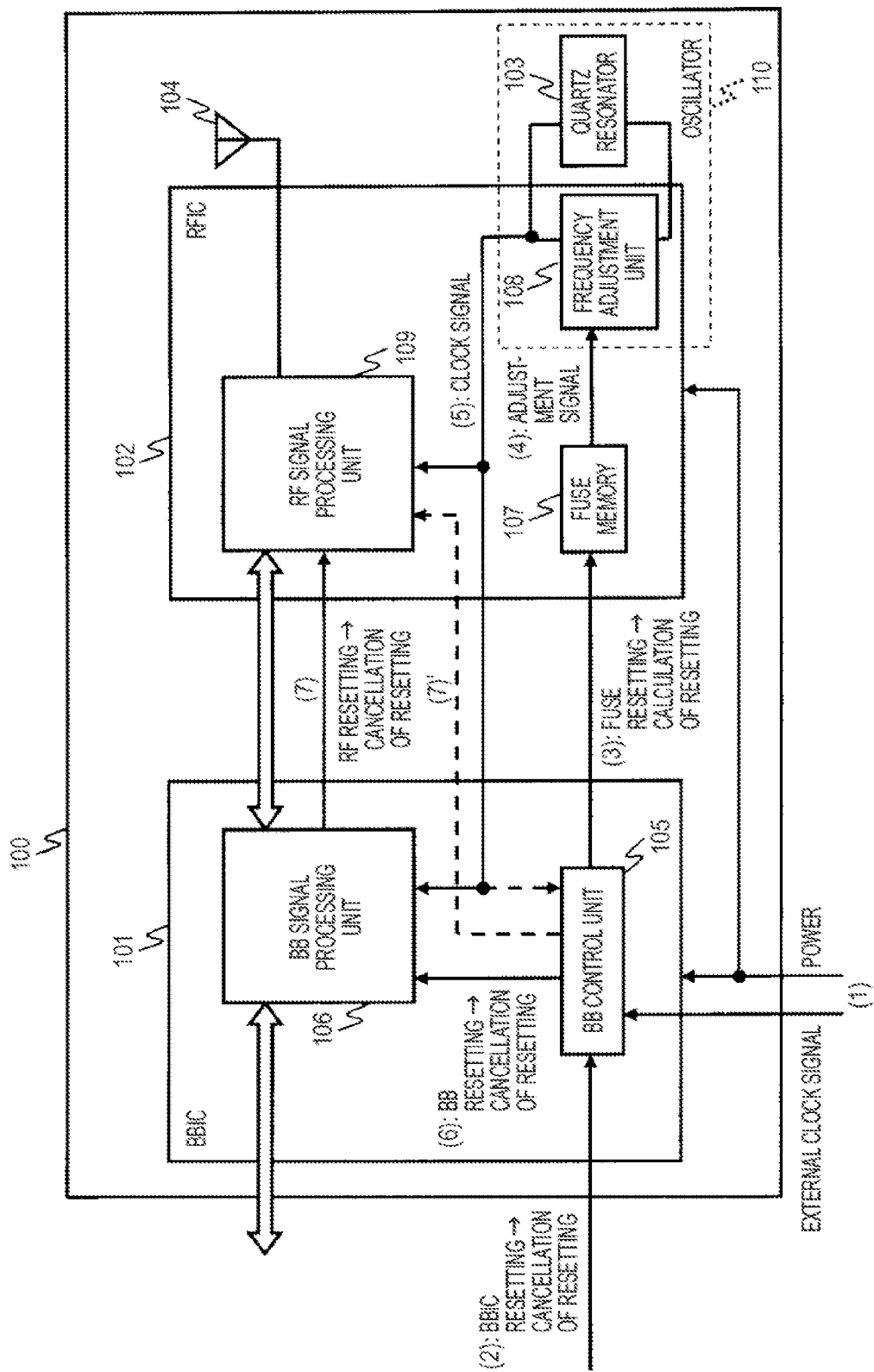
FIG. 1 is a block diagram showing the internal configuration of a wireless communication device 100 according to a first embodiment of the present invention.

FIG. 1 is a block diagram showing the internal configuration of a wireless communication device 100 according to a first embodiment of the invention. As shown in FIG. 1, the wireless communication device 100 according to the first embodiment includes a BB IC (baseband IC) 101, an RF IC (radio-frequency IC) 102, a quartz resonator 103, and an antenna 104. The BBIC 101 has a BB control unit 105 and a BB signal processing unit 106. The RFIC 102 has a fuse memory 107, a frequency adjusting unit 108, and an RF signal processing unit 109. The quartz resonator 103 and the frequency adjusting unit 108 constitute an oscillation circuit 110. The individual components will be described below. The parenthesized numbers in FIG. 1 indicate the order of an activation procedure which is followed when the wireless communication device 100 is powered on.

The BB control unit 105 operates on an external clock signal that is supplied from outside the wireless communication device 100. When BBIC resetting is canceled after its activation, the BB control unit 105 controls each of resetting of the fuse memory 107 of the RFIC 102 and resetting of the BB signal processing unit 106 with prescribed timing. If a reset signal that is input to the BB control unit 105 is at a low (L) level, BBIC resetting is made active. The BBIC resetting is canceled when the reset signal turns to a high (H) level later. The polarities of the reset signal are not limited to the above; resetting may be made active when the reset signal is at the high (H) level and canceled when the reset signal turns to the low (L) level. The following description will be made with the assumption that resetting may be made active when the reset signal is at the low (V) level and canceled when the reset signal turns to the high (H) level.

The BB control unit 105 controls resetting of the fuse memory 107 of the RFIC 102 after the cancellation of the BBIC resetting. The BB control unit 105 cancels resetting of the BB signal processing unit 106 when a prescribed time has elapsed from the cancellation of the resetting of the fuse memory 107 by the BB control unit 105 or input of a stable clock signal from the oscillation circuit 110 is detected.

Operating on a clock signal that is supplied from the RFIC 102 (described later), the BB signal processing unit 106 performs baseband signal processing. More specifically, the BB signal processing unit 106 generates a baseband modulated signal by modulating digital data to be sent by a prescribed modulation method and demodulates a reception signal that is received from the RF signal processing unit 109 of the RFIC 102 into original digital data. Furthermore, the BB signal processing unit 106 performs media access control (MAC). Resetting of the BB signal processing unit 106 is controlled by the BB control unit 105. BB resetting is made active if a reset signal that is input to the BB signal processing unit 106 is at the low (L) level, and is canceled when the reset signal turns to the high (H) level later.

The fuse memory 107 is a write-once memory provided in the RFIC 102. The fuse memory 107 stores an adjustment value(s) to be used for setting the constant of a load capacitance of the oscillation circuit 110. This adjustment value is written to the fuse memory 107 in advance, that is, before shipment of the wireless communication device 100.

Resetting of the fuse memory 107 is controlled by the BB control unit 105 of the BBIC 101. When fuse resetting is canceled after its activation, the fuse memory 107 outputs an adjustment signal indicating the adjustment value stored therein. Fuse resetting is made active if a reset signal that is input to the fuse memory 107 is at the low (L) level, and is canceled when the reset signal turns to the high (H) level later. A signal of all—"1" (or all—"0") data is output from the fuse memory 107 whose fuse resetting is in the active state.

As described above, the frequency adjusting unit 108 constitutes the oscillation circuit 110 together with the quartz resonator 103. The frequency adjusting unit 108 adjusts the constant of the load capacitance of the oscillation circuit 110 on the basis of the adjustment signal that is supplied from the fuse memory 107. As a result, the oscillation circuit 110 outputs a clock signal having a prescribed frequency.

Figure 2:
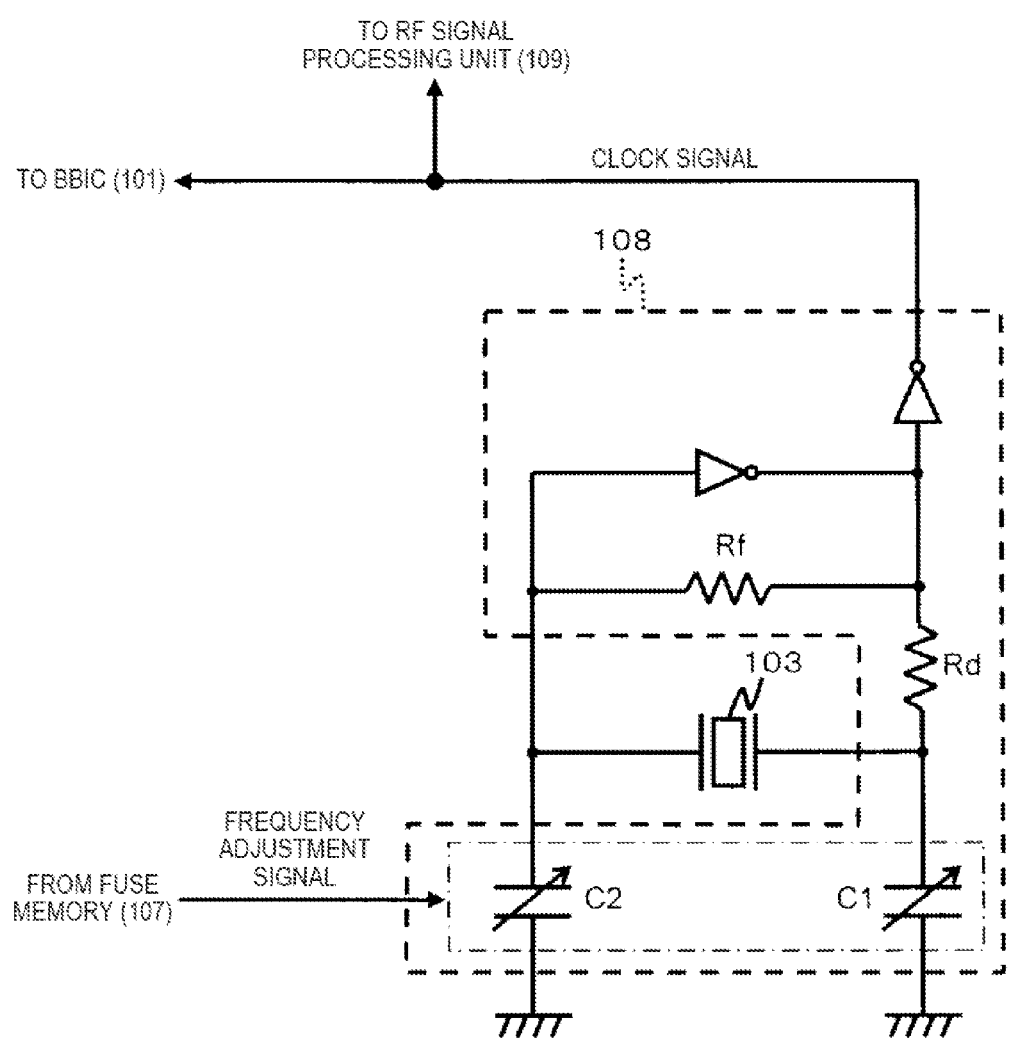
FIG. 2 shows an example circuit of an oscillation circuit 110 having a frequency adjusting unit 108 and a quartz resonator 103.

FIG. 2 shows an example circuit of the oscillation circuit 110 having the frequency adjusting unit 108 and the quartz resonator 103. As shown in FIG. 2, the frequency adjusting unit 108 includes two capacitors C1 and C2, a feedback resistor Rf, a damping resistor Rd, and two inverters. The capacitors C1 and C2 are variable capacitors and their capacitances are set to values corresponding to an adjustment signal supplied form the fuse memory 107. The frequency of a clock signal that is output from the oscillation circuit 110 can be adjusted by varying the capacitance values of the capacitors C1 and C2.

The feedback resistor Rf feeds back a current from the output side of the oscillation-stage inverter and thereby continues the oscillation of the quartz resonator 103. The damping resistor Rd limits a current that flows through the quartz resonator 103. The adjustment signal that is output from the fuse memory 107 may include not only values for adjustment of the capacitance values of the capacitors C1 and C2 but also an adjustment value to be used for setting the resistance value of the damping resistor Rd which serves to adjust the drive current of the frequency adjusting unit 108. In this case, a variable resistor is used as the damping resistor Rd. As is commonly known, the oscillation circuit 110 is allowed to operate stably by adjusting the resistance value of the damping resistor Rd to an optimum value.

As mentioned above, in a state that fuse resetting of the fuse memory 107 is active, the fuse memory 107 outputs a signal of all—"1" (or all—"0") data. The oscillation circuit 110 does not oscillate even if this signal is input to it. Even if it oscillates, the oscillation frequency is far from the prescribed frequency.

Operating on the clock signal supplied from the oscillation circuit 110, the RF signal processing unit 109 performs radio-frequency signal processing. More specifically, the RF signal processing unit 109 frequency-converts a baseband modulated signal that is input from the BB signal processing unit 106 to a signal having a prescribed carrier frequency, amplifies the latter into a signal having a prescribed transmission power, and sends out the latter from the antenna 104. The RF signal processing unit 109 frequency-converts a radio-frequency signal received by the antenna 104 to a baseband signal, and supplies the baseband signal to the BB signal processing unit 106. Resetting of the RF signal processing unit 109 is controlled by the BB control unit 105 or the BB signal processing unit 106 of the BBIC 101. RF resetting is made active if a reset signal that is input to the RF signal processing unit 109 is at the low (L) level and is canceled when the reset signal turns to the high (H) level.

Figure 3:
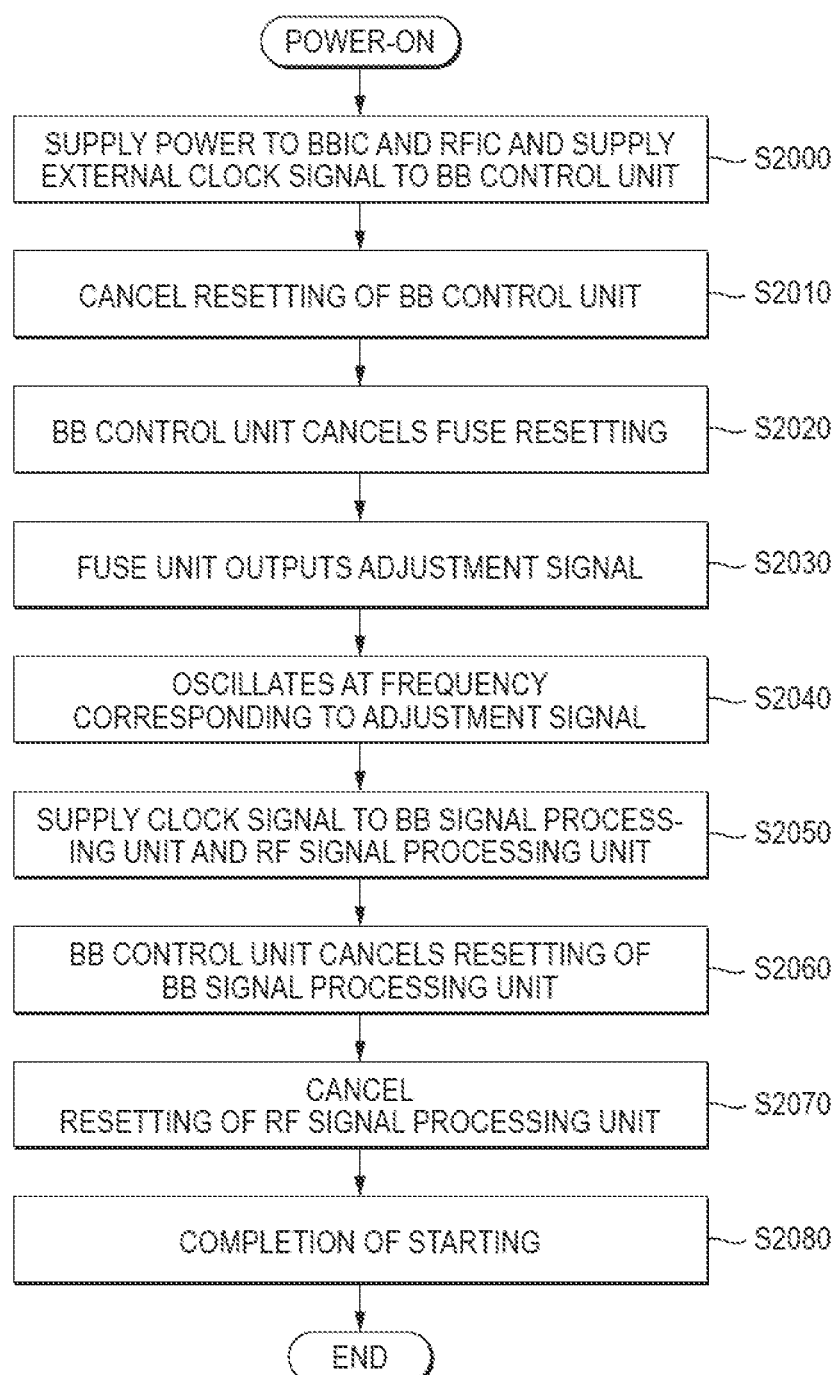

A description will be hereinafter made of how the wireless communication device 100 according to the first embodiment operates at the time of power-on. FIG. 3 is a flowchart of an activation procedure which is followed when the wireless communication device 100 according to the first embodiment is powered on.

When the wireless communication device 100 is powered on, power is supplied to the BBIC 101 and the RFIC 102 and an external clock signal is supplied to the BB control unit 105 (step 2000; indicated by symbol (1) in FIG. 1). Subsequently, resetting of the BB control unit 105 is made active and then canceled (step 2010; indicated by symbol (2) in FIG. 1). Next, the BB control unit 105 makes resetting of the fuse memory 107 active and cancels it (step 2020; indicated by symbol (3) in FIG. 1). The timing of cancellation of the resetting of the fuse memory 107 by the BB control unit 105 is determined on the basis of a time that is taken from a start of power supply to the RFIC 102 to establishment of a state that the RFIC 102 can receive a signal from the outside.

Then the fuse memory 107 outputs an adjustment signal indicating the adjustment values stored therein (step 2030; indicated by symbol (4) in FIG. 1). Then the oscillation circuit 110 starts oscillating at a frequency corresponding to the adjustment signal (step 2040). A clock signal that is output from the oscillation circuit 110 is then supplied to the BB signal processing unit 106 and the RF signal processing unit 109 (step 2050; indicated by symbol (5) in FIG. 1).

Subsequently, the BB control unit 105 makes resetting of the BB signal processing unit 106 active and then cancels it (step 2060; indicated by symbol (6) in FIG. 1). The BB control unit 105 cancels the resetting of the BB signal processing unit 106 when a time has elapsed that is taken from cancellation of resetting of the fuse memory 107 by the BB control unit 105 to stable oscillation of the oscillation circuit 110. Where the clock signal that is output from the oscillation circuit 110 is also input to the BB control unit 105, the BB control unit 105 may cancel the resetting of the BB signal processing unit 106 when the BB control unit 105 has detected input of a stable clock signal.

Next, the BB signal processing unit 106 makes resetting of the RF signal processing unit 109 active and the cancels it (step 2070; indicated by symbol (7) in FIG. 1). Step 2070 may be executed at the same time as step S2060 by the BB control unit 105. That is, the BB control unit 105 may make resetting of the RF signal processing unit 109 and then cancel it (indicated by symbol (7') in FIG. 1). The activation of the wireless communication device 100 is thus completed (step 2080), whereupon the wireless communication device 100 is rendered in a communicatable state.

As described above, in this embodiment, resetting of the BB signal processing unit 106 and the RF signal processing unit 109 is canceled after cancellation of resetting of the fuse memory 107 and subsequent supply of a clock signal to the BB signal processing unit 106 and the RF signal processing unit 109 from the oscillation circuit 110 being in a state of oscillating stably. Since in this manner the BB signal processing unit 106 and the RF signal processing unit 109 are activated in a state that they are being supplied with a clock signal having a stable, prescribed frequency, the wireless communication device 100 can be activated correctly at the time of power-on.

Furthermore, because of the configuration that the BBIC 101 controls fuse resetting and RF resetting, the wireless communication device 100 has only one reset terminal which is the terminal for BBIC resetting. Since the number of terminals of the wireless communication device 100 is thus kept small, the wireless communication device 100 can be miniaturized. Still further, since a user of the wireless communication device 100 needs to control only BBIC resetting, the load of the user does not increase.

(Embodiment 2)

Figure 4:
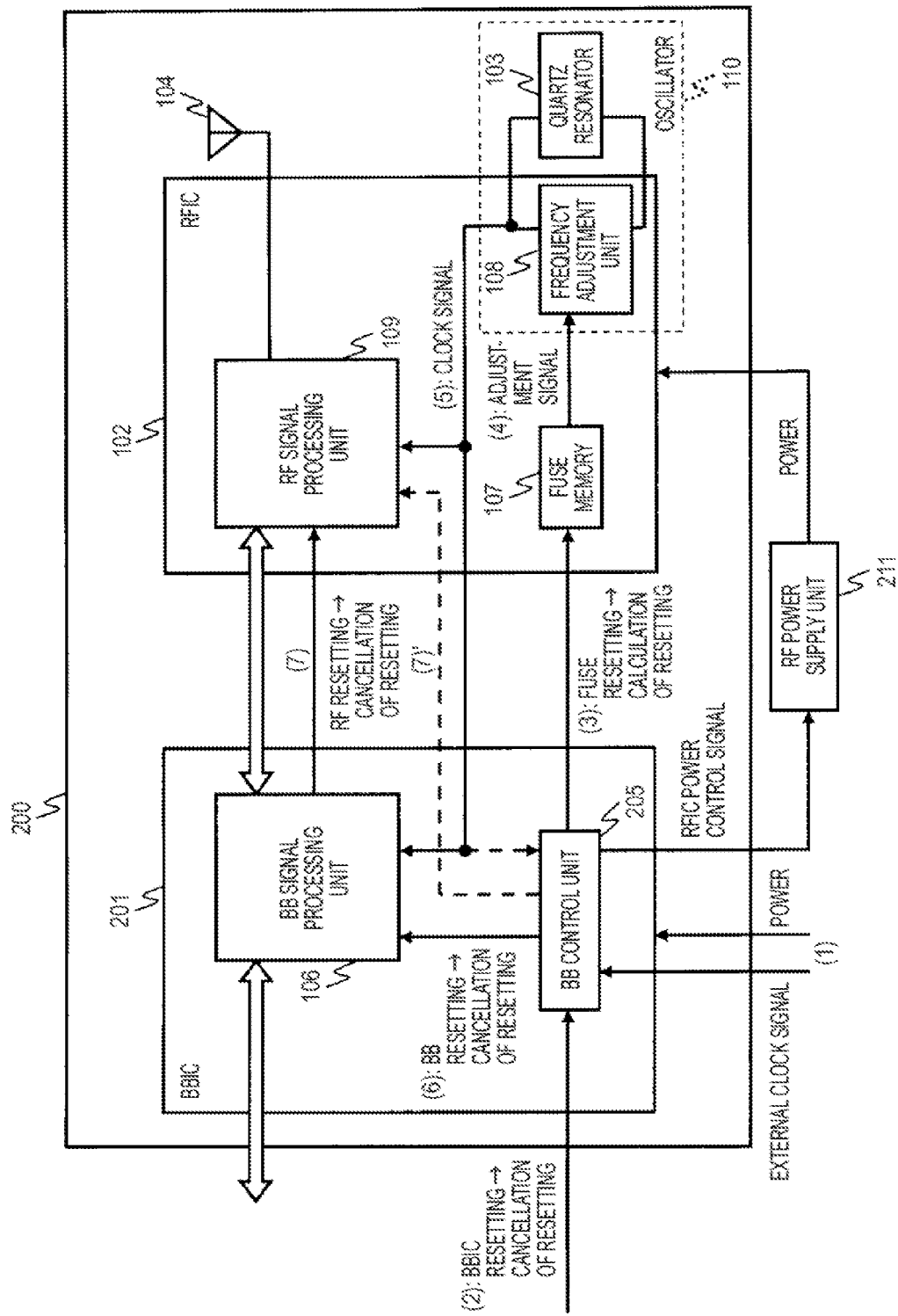
FIG. 4 is a block diagram showing the internal configuration of a wireless communication device 200 according to a second embodiment of the invention.

FIG. 4 is a block diagram showing the internal configuration of a wireless communication device 200 according to a second embodiment of the invention. The wireless communication device 200 according to the second embodiment is different from the wireless communication device 100 according to the first embodiment in that the BB control unit 105 of the BBIC 101 controls power supply to the RFIC 102. The second embodiment is the same as the first embodiment in the respects other than this. Therefore, components in FIG. 4 having the same ones in FIG. 1 are given the same symbols as the latter and descriptions therefor will be omitted.

As shown in FIG. 4, an RF power supply unit 211 is provided outside the wireless communication device 200. After cancellation of BBIC resetting, the BB control unit 205 of the BBIC 201 outputs an RFIC power control signal for controlling power supply to the RFIC 102. The RF power supply unit 211 supplies power to the RFIC 102 according to the RFIC power control signal. It is preferable that the RF power supply unit 211 and a power supply unit for the BBIC 201 be a common component.

Figure 5:
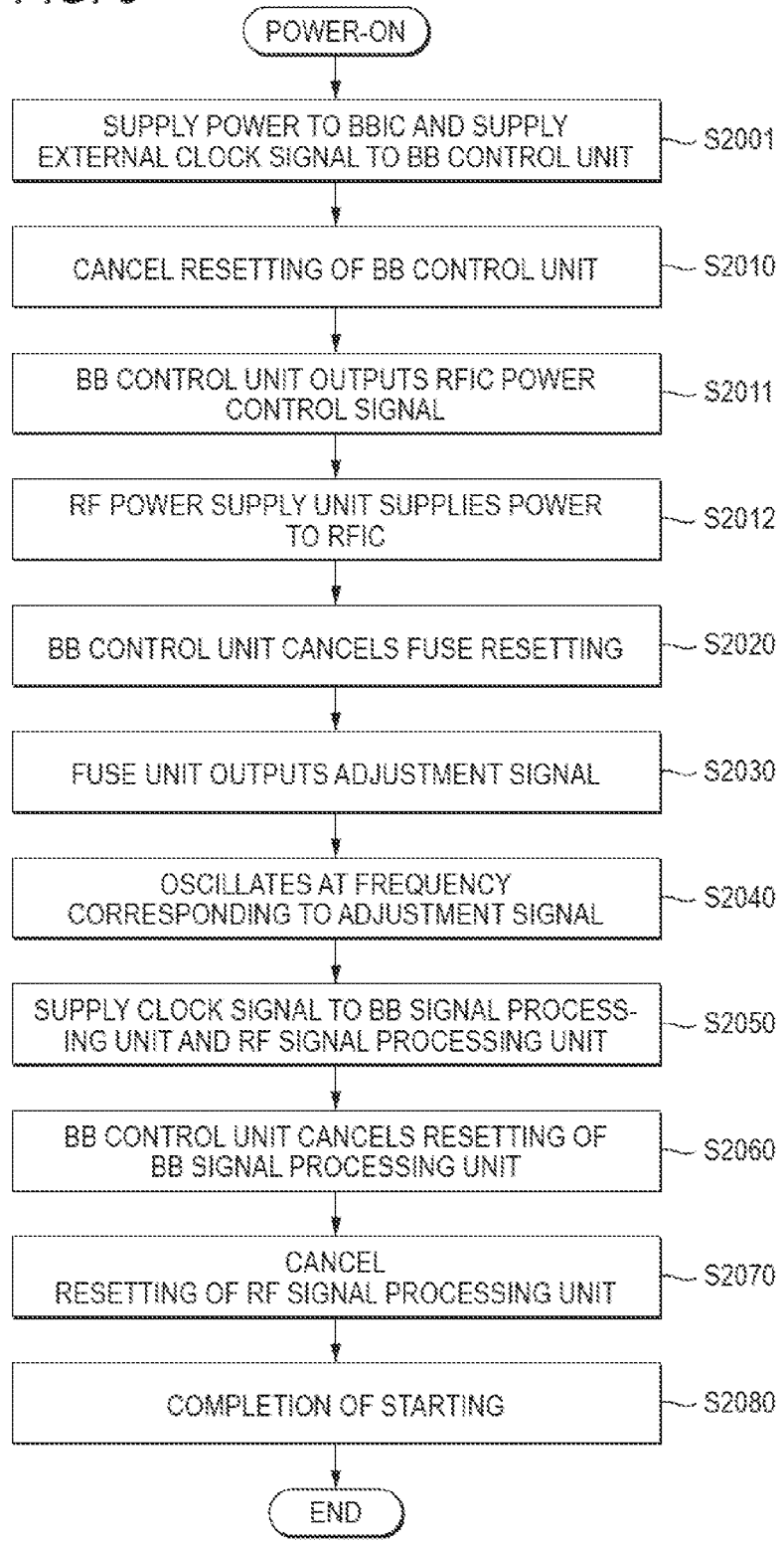
Figure 6:
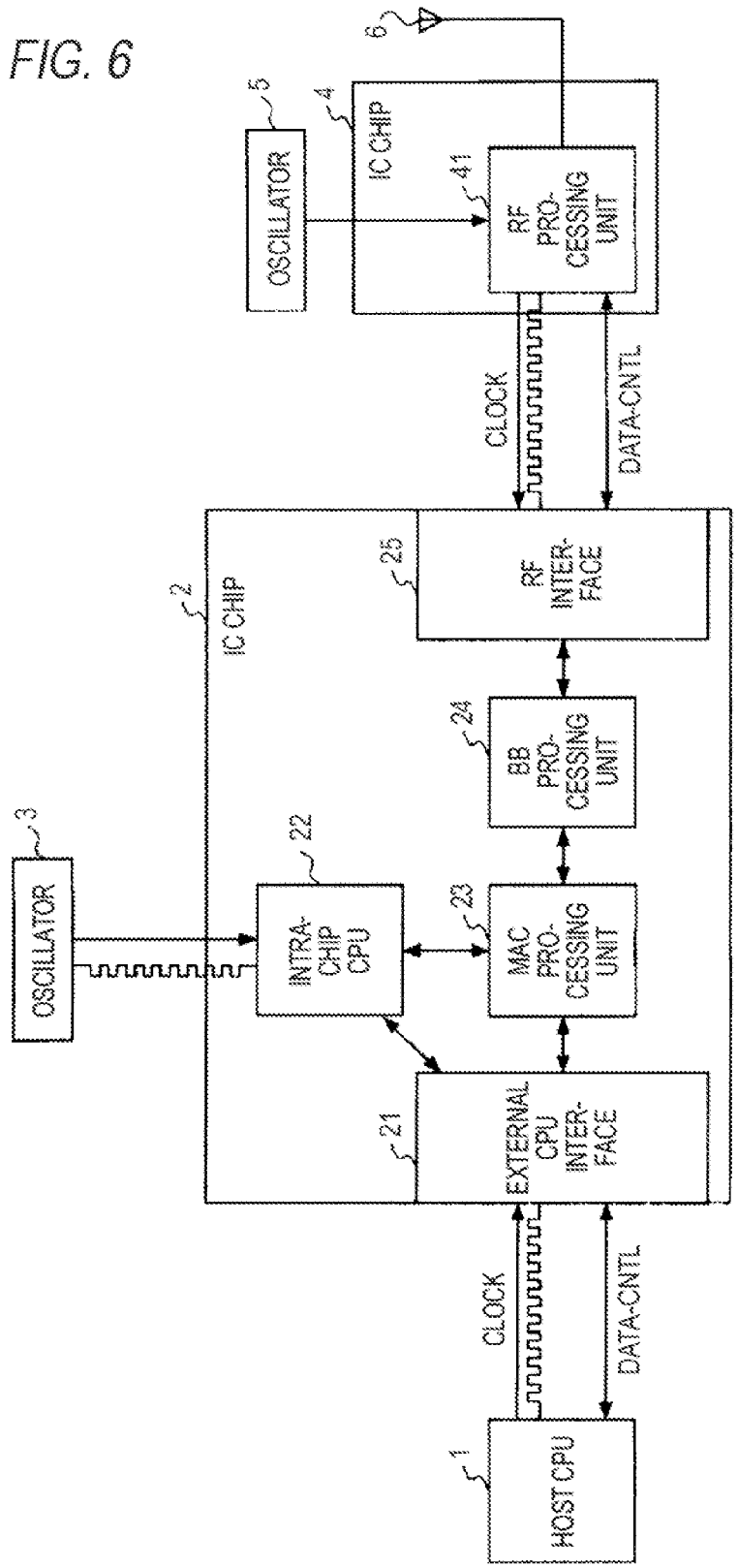
FIG. 6 shows the configuration of a wireless LAN device disclosed in Patent document 1.

FIG. 5 is a flowchart of an activation procedure which is followed when the wireless communication device 200 according to the second embodiment is powered on. In this embodiment, step S2001 is executed instead of step S2000 in the flowchart of the first embodiment shown in FIG. 3 and steps 2011 and 2012 are executed between steps 2010 and S2020.

At step S2001, power is supplied to the BBIC 201 and an external clock signal is supplied to the BB control unit 205 (indicated by symbol (1) in FIG. 4). At step S2011 which is executed after step S2010, the BB control unit 205 outputs an RFIC power control signal. Then the RF power supply unit 211 starts supplying power to the RFIC 102 (step 2012). The BB control unit 205 makes fuse resetting active after the start of power supply to the RFIC 102.

As described above, according to this embodiment, the RFIC 102 can be powered off completely because the BB control unit 205 of the RFIC 102 controls the supply of power to the RFIC 102. Therefore, this embodiment makes it possible to let the power consumption even smaller than in the first embodiment in the case where it is desired to lower the power consumption of the wireless communication apparatus 200 as in the case of a sleep state. For example, where a necessary communication should be performed every time recovery is made from a sleep state periodically with only the BB control unit 205 kept activated in each sleep state, step 2011 and the following steps shown in FIG. 5 may be executed to recover the wireless communication device 200 from a sleep state.

Although the above description is directed to the case that the RF power supply unit 211 is provided outside the wireless communication device 200, the RF power supply unit 211 may be provided inside a wireless communication device. This provides an advantage that the control is made easier and the user load is not increased because the number of terminals of the wireless communication device can be reduced.

Although the preferred embodiments of the invention have been described above, the invention is not limited to those embodiments. Various changes are possible without departing from the spirit and scope of the invention and such changes are included in the scope of the invention.

Although each embodiment is directed to an example case that the invention is implemented by hardware, the invention can also be implemented by software in coordination with hardware.

Each of the functional blocks used in the description of each embodiment is typically implemented as an LSI which is an integrated circuit. The functional blocks may be implemented in one-chip form individually or all or part of them may be implemented as one chip. Although the term "LSI" is used above, other terms "IC," "system LSI," "super LSI," and "ultra LSI" may also be used depending on the integration density.

The manner of circuit integration is not limited to formation of an LSI and may be formation of a dedicated circuit or use of a general-purpose processor. An FPGA (field programmable gate array) which can be programmed after implementation as an LSI or a reconfigurable processor in which connections between and settings of circuit cells can be reconfigured may also be used.

Further, if an integrated circuit technology to replace the LSI formation technology appears as a result of advancement of the semiconductor technologies or birth of another, spin-off technology, naturally the integration of the functional blocks may be attained using such a technology. One possibility is use of a biotechnology.

Although each embodiment employs the antenna, an antenna port can be used in the same manner. The antenna port means a logical antenna which is a single or plural physical antennas. That is, the term "antenna port" does not necessarily mean a single physical antenna and may mean, for example, an array antenna which consists of plural antennas. For example, in the LTE (Long Term Evolution), it is not prescribed how many physical antennas constitute an antenna port and base stations are defined as minimum units capable of transmitting different reference signals. The antenna port may also be defined as a minimum unit for multiplication of precoding vector weights.

Although the invention has been described in detail by referring to the particular embodiments, it is apparent to those skilled in the art that various changes and modifications are possible without departing from the spirit and scope of the invention.

The present application is based on Japanese Patent Application No. 2013-032001 filed on Feb. 21, 2013, the disclosure of which is incorporated herein by reference.

INDUSTRIAL APPLICABILITY

The wireless communication device according to the invention can be applied to various wireless communication devices of wireless LAN, ZigBee (registered trademark), Bluetooth (registered trademark), etc. which are composed of a BBIC and an RFIC. Enabling miniaturization, the wireless communication device according to the invention is particularly useful when incorporated in portable terminals.

DESCRIPTION OF SYMBOLS 100, 200: Wireless communication device
101, 201: BBIC
102: RFIC
103: Quartz resonator 104: Antenna
105, 205: BB control unit
106: BB signal processing unit
107: Fuse memory
108: Frequency adjusting unit
109: RF signal processing unit
110: Oscillation circuit
211: RF power supply unit

The invention claimed is:

1. A wireless communication device comprising:
a baseband integrated circuit (BBIC), that performs baseband signal processing;
a radio frequency integrated circuit (RFIC), that performs radio-frequency signal processing; and
a quartz resonator,
wherein the RFIC including:
a storage unit that stores an adjustment value for adjusting a frequency of a clock signal that is based on an oscillation frequency of the quartz resonator, and outputs the adjustment value when a resetting of the storage unit is canceled so that the resetting of the storage unit is not active;
a frequency adjusting unit that adjusts the frequency of the clock signal according to the adjustment value stored in the storage unit; and
a radio frequency (RF) signal, processing unit that operates based on the clock signal and performs the radio-frequency signal processing;
wherein the clock signal output from an oscillation circuit having the quartz oscillator and the frequency adjusting unit is supplied to the RF signal processing unit and the BBIC; and
wherein the BBIC controls the resetting of the storage unit and a resetting of the baseband signal processing to be performed by the BBIC.

2. The wireless communication device according to claim 1, wherein the BBIC cancels the resetting of the baseband signal processing after the clock signal is input to the BBIC by canceling the resetting of the storage unit.

3. The wireless communication device according to claim 2, wherein the BBIC cancels the resetting of the baseband signal processing after a lapse of a prescribed time from the cancellation of the resetting of the storage unit.

4. The wireless communication device according to claim 2, wherein the BBIC cancels the resetting of the baseband signal processing when detecting input of the clock signal after canceling the resetting of the storage unit.

5. The wireless communication device according to claim 1, wherein the BBIC cancels the resetting of the radio-frequency signal processing to be performed by the RF signal processing unit after canceling the resetting of the baseband signal processing.

6. The wireless communication device according to claim 1, wherein the BBIC cancels resetting of the radio-frequency signal processing to be performed by the RF signal processing unit after input of the clock signal to the BBIC after canceling the resetting of the storage unit.

7. The wireless communication device according to claim 1, wherein the BBIC includes:
a BB signal processing unit that operates based on the clock signal and performs the baseband signal processing; and
a BB control unit that controls the resetting of the storage unit and the resetting of the baseband signal processing to be performed by the BBIC.

8. The wireless communication device according to claim 7, wherein the BBIC includes:
a BB clock terminal that supplies an external clock signal to the BB control unit; and
a BB reset terminal that controls a resetting of the BB control unit.

9. The wireless communication device according to claim 1, wherein the BBIC controls power supply to the RFIC.

10. An activation method of a wireless communication device having a baseband integrated circuit,(BBIC), that performs a baseband signal processing, a radio frequency integrated circuit,(RFIC), that performs a radio-frequency signal processing, and a quartz resonator, wherein the RFIC includes a storage unit that stores an adjustment value for adjusting a frequency of a clock signal that is based on an oscillation frequency of the quartz resonator, the activation method comprising:
outputting the adjustment value by the storage unit when a resetting of the storage unit is canceled so that the resetting of the storage unit is not active;
adjusting the frequency of the clock signal according to the adjustment value stored in the storage unit;
supplying the clock signal output from an oscillation circuit having the quartz oscillator to a radio frequency (RF) signal processing unit, and the BBIC; and
controlling by the BBIC the resetting of the storage unit and a resetting of the baseband signal processing to be performed by the BBIC.

* * * * *